United States Patent
Suenaga

(10) Patent No.: US 9,812,630 B2
(45) Date of Patent: Nov. 7, 2017

(54) PIEZOELECTRIC ELEMENT, AND PIEZOELECTRIC VIBRATING DEVICE, PORTABLE TERMINAL, ACOUSTIC GENERATOR, ACOUSTIC GENERATING DEVICE AND ELECTRONIC APPARATUS INCLUDING THE SAME

(71) Applicant: KYOCERA Corporation, Kyoto-shi, Kyoto (JP)

(72) Inventor: Hiroshi Suenaga, Kirishima (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 481 days.

(21) Appl. No.: 14/400,912

(22) PCT Filed: Sep. 30, 2013

(86) PCT No.: PCT/JP2013/076562
§ 371 (c)(1),
(2) Date: Nov. 13, 2014

(87) PCT Pub. No.: WO2014/069138
PCT Pub. Date: May 8, 2014

(65) Prior Publication Data
US 2015/0130325 A1    May 14, 2015

(30) Foreign Application Priority Data

Oct. 31, 2012 (JP) .................. 2012-240224

(51) Int. Cl.
*H01L 41/047* (2006.01)
*H01L 41/083* (2006.01)
(Continued)

(52) U.S. Cl.
CPC ........ *H01L 41/0477* (2013.01); *B06B 1/0662* (2013.01); *H01L 41/047* (2013.01);
(Continued)

(58) Field of Classification Search
CPC .. H01L 41/047; H01L 41/0477; H01L 41/083
(Continued)

(56) References Cited

U.S. PATENT DOCUMENTS 7,982,367 B2 * 7/2011 Uetani .................. C04B 35/491
310/328
2007/0177746 A1    8/2007 Kobayashi et al.
(Continued)

FOREIGN PATENT DOCUMENTS

CN        102450034 A    5/2012
JP        2002-010393 A   1/2002
(Continued)

OTHER PUBLICATIONS

Chinese Office Action with English concise explanation, Chinese Patent Application No. 201380023907.3, May 5, 2016, 6 pgs.
(Continued)

*Primary Examiner* — Derek Rosenau
(74) *Attorney, Agent, or Firm* — Volpe and Koenig, P.C.

(57) ABSTRACT

There are provided a piezoelectric element in which the peeling of a surface electrode is suppressed, and a piezoelectric vibrating device, a portable terminal, an acoustic generator, an acoustic generating device and an electronic apparatus including the same. A piezoelectric actuator includes a piezoelectric element including a plate-shaped stacked body including inner electrodes and piezoelectric layers laminated, a surface electrode disposed on one of main surfaces of the stacked body, the surface electrode being electrically connected to the inner electrodes. The surface electrode has a first area and a second area. The first area is an area mainly containing silver, and the second area is an area mainly containing silver and palladium and disposed so as to contact a piezoelectric layer.

15 Claims, 5 Drawing Sheets

(51) Int. Cl.
*H04R 17/00* (2006.01)
*H01L 41/273* (2013.01)
*B06B 1/06* (2006.01)
*H01L 41/187* (2006.01)

(52) U.S. Cl.
CPC ........ *H01L 41/0472* (2013.01); *H01L 41/083* (2013.01); *H01L 41/273* (2013.01); *H04R 17/00* (2013.01); *H01L 41/187* (2013.01)

(58) Field of Classification Search
USPC .......................................... 310/328, 363–366
See application file for complete search history.

(56) References Cited

U.S. PATENT DOCUMENTS

| | | | | |
|---|---|---|---|---|
| 2010/0240998 | A1* | 9/2010 | Calisti | A61B 8/00 600/446 |
| 2011/0285249 | A1 | 11/2011 | Ishii et al. | |
| 2014/0314255 | A1* | 10/2014 | Fukuoka | H04R 17/00 381/190 |

FOREIGN PATENT DOCUMENTS

| | | | | |
|---|---|---|---|---|
| JP | 2006-238072 A | | 9/2006 | |
| JP | 2008-211047 A | | 9/2008 | |
| JP | 2012-209866 A | | 10/2012 | |
| WO | 2005/004535 A1 | | 1/2005 | |
| WO | 2010/087470 A1 | | 8/2010 | |
| WO | WO 2011-162002 | * | 12/2011 | ............ H04R 17/00 |
| WO | 2012/117738 A1 | | 9/2012 | |

OTHER PUBLICATIONS

International Search Report, PCT/JP2013/076562, Dec. 24, 2013, 2 pgs.

* cited by examiner (a)

(b)

(a)

(b)

(c)

PIEZOELECTRIC ELEMENT, AND PIEZOELECTRIC VIBRATING DEVICE, PORTABLE TERMINAL, ACOUSTIC GENERATOR, ACOUSTIC GENERATING DEVICE AND ELECTRONIC APPARATUS INCLUDING THE SAME

TECHNICAL FIELD

The present invention relates to a piezoelectric element suitable for a piezoelectric vibrating device and a portable terminal, and a piezoelectric vibrating device, a portable terminal, an acoustic generator, an acoustic generating device and an electronic apparatus including the same.

BACKGROUND ART

A bimorph piezoelectric element comprising a stacked body comprising inner electrodes and piezoelectric layers laminated and a surface electrode formed on a surface of the stacked body is known as a piezoelectric element (refer to Patent Literature 1).

Moreover, a piezoelectric vibrating device comprising a bimorph piezoelectric element and a vibrating plate to which a central portion or one end in a longitudinal direction of the bimorph piezoelectric element is fixed is known (refer to Patent Literature 2 and Patent Literature 3)

CITATION LIST

Patent Literature

Patent Literature 1: Japanese Unexamined Patent Publication JP-A 2002-10393
Patent Literature 2: International Publication WO 2005/004535
Patent Literature 3: Japanese Unexamined Patent Publication JP-A 2006-238072

SUMMARY OF INVENTION

Technical Problem

Here, as the surface electrode disposed on the surface of the piezoelectric element, a baked Ag electrode is generally used, in which the whole area thickness and the surface condition are uniformly formed over the entire region so that the piezoelectric element is driven in the entire surface region almost uniformly.

However, when the stress due to displacement of the piezoelectric element is applied to the surface electrode, a microcrack may be generated in an interface between the surface electrode and the piezoelectric layer when driving the element for a long period of time, and the surface electrode may be peeled off, as a result, there is a possibility that a displacement amount becomes unstable.

In addition there is a possibility that the piezoelectric vibrating device, the portable terminal, the acoustic generator, the acoustic generating device and the electronic apparatus including the piezoelectric element are not stably driven for a long period of time when the surface electrode of the piezoelectric element is peeled off.

The invention has been made in view of the above circumstances, and an object thereof is to provide a piezoelectric element in which the peeling of the surface electrode is suppressed, and a piezoelectric vibrating device, a portable terminal, an acoustic generator, an acoustic generating device and an electronic apparatus including the same.

Solution to Problem

A piezoelectric element of the invention includes a plate-shaped stacked body including inner electrodes and piezoelectric layers laminated, and a surface electrode disposed on one of main surfaces of the plate-shaped staked body, the surface electrode being electrically connected to the inner electrodes, the surface electrode having a first area and a second area, the first area being an area mainly containing silver, and the second area being an area mainly containing silver palladium and disposed so as to contact a piezoelectric layer.

In addition, a piezoelectric vibrating device of the invention includes the piezoelectric element mentioned above, and a vibrating plate joined to the other main surface of the piezoelectric element.

Further, a portable terminal of the invention includes the piezoelectric element mentioned above an electronic circuit, a display, and a housing, the other main surface of the piezoelectric element being joined to the display or the housing.

Furthermore, an acoustic generator of the invention includes the piezoelectric element mentioned above, a vibrating plate to which the piezoelectric element is attached and which vibrates with the piezoelectric element by vibration of the piezoelectric element, and a frame body disposed at an outer peripheral portion of the vibrating plate.

Furthermore, an acoustic generating device of the invention includes the acoustic generator mentioned above and a housing configured to accommodate the acoustic generator.

Furthermore, an electronic apparatus of the invention includes the acoustic generator, an electronic circuit connected to the acoustic generator, and a housing configured to accommodate the electronic circuit and the acoustic generator, the electronic apparatus having a function of generating sound from the acoustic generator.

Advantageous Effects of Invention

According to the piezoelectric element of the invention, since the surface electrode has the first area and the second area, the first area is the area mainly containing silver, the second area is the area mainly containing silver palladium and disposed so as to contact the piezoelectric layer, it is possible to suppress the peeling of the surface electrode and to realize stabilization of the displacement amount for a long period of time.

In addition, according to the piezoelectric vibrating device, the portable terminal, the acoustic generator, the acoustic generating device and the electronic apparatus of the invention, the stable driving for a long period of time can be realized.

DESCRIPTION OF EMBODIMENTS

Figure 1:
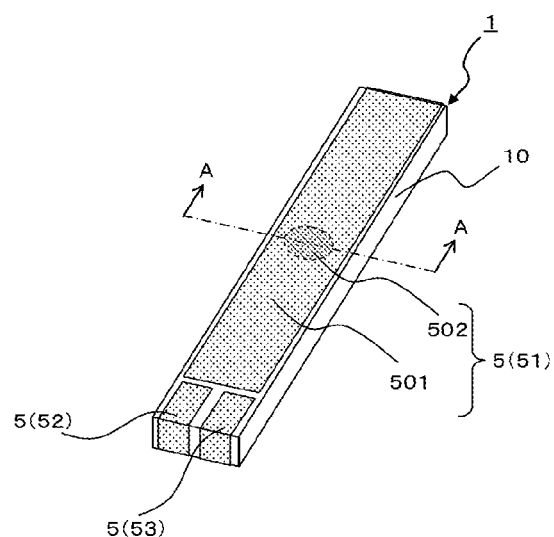
FIG. 1(a) is a schematic perspective view showing an example of a piezoelectric element according to an embodiment of the invention.
FIG. 1(b) is a schematic cross-sectional view taken along the line A-A shown in FIG. 1(a)
Figure 1:
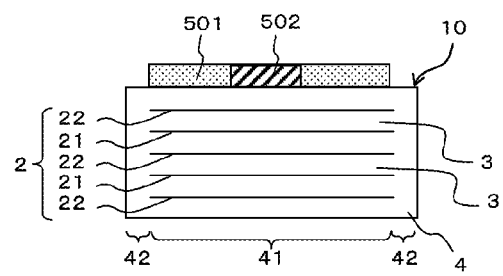

An example of a piezoelectric element according to an embodiment of the invention will be explained in detail with reference to the drawings, FIG. 1 is a schematic perspective view showing an example of a piezoelectric element according to an embodiment of the invention, and FIG. 2(a) is a schematic cross-sectional view taken along the line A-A shown in FIG. 1(b).

A piezoelectric element 10 according to the embodiment shown in FIG. 1 includes a plate-shaped stacked body 4 including inner electrodes 2 and piezoelectric layers 3 laminated, and a surface electrode 5 disposed on one of main surfaces of the stacked body 4, the surface electrode being electrically connected to the inner electrodes 2, the surface electrode 5 having a first area 501 and a second area 502, the first area 501 being an area mainly containing silver, and the second area 502 being an area mainly containing silver palladium and disposed so as to contact a piezoelectric layer 3.

The stacked body 4 constituting the piezoelectric element 10 is formed in a plate shape by laminating the inner electrodes 2 and the piezoelectric layers 3, and includes an active portion 41 in which plural inner electrodes 2 are overlaid in a stacking direction and an inactive portion 42 corresponding to portions other than the active portion 41, and the stacked body is formed, for example, in an elongated shape. In the case of the piezoelectric element to be installed in a display or a housing of a portable terminal, a length of the stacked body 4 is preferably, for example, 18 mm to 23 mm, and more preferably, 22 mm to 25 mm. A width of the stacked body 4 is preferably, for example, 1 mm to 6 mm, and more preferably, 3 mm to 4 mm. A thickness of the stacked body 4 is preferably, for example, 0.2 mm to 1.0 mm, and more preferably, 0.4 mm to 0.8 mm.

The inner electrodes 2 constituting the stacked body 4 are formed by co-firing with the ceramics forming the piezoelectric layers 3, and are composed of first electrodes 21 and second electrodes 22. For example, the first electrodes 21 are positive electrodes or negative electrodes, and the second electrodes 22 are ground electrodes. The inner electrodes 2 are alternately laminated with the piezoelectric layers 3 so as to sandwich the piezoelectric layers 3 from above and below. When the first electrodes 21 and the second electrodes 22 are arranged in the stacked order, thereby applying drive voltage to the piezoelectric layers 3 sandwiched therebetween. As materials for forming the inner electrode, for example, a conductor mainly containing silver or a silver-palladium alloy which has low reactivity with piezoelectric ceramics, or a conductor containing copper, platinum or the like can be used, and ceramic components or glass components can be contained in the conductor.

In the example shown in FIG. 1, end portions of the first electrodes 21 and the second electrodes 22 are alternately led out to a pair of mutually opposed side surfaces of the stacked body 4. In the case of the piezoelectric element installed in the display or the housing of the portable terminal, a length of the inner electrode 2 is preferably, for example, 17 mm to 25 mm, and more preferably 21 mm to 24 mm. A width of the inner electrode 2 is preferably, for example, 1 mm to 5 mm, and more preferably 2 mm to 4 mm. A thickness of the inner electrode 2 is preferably, for example, 0.1 to 5 μm.

The piezoelectric layers 3 constituting the stacked body 4 are made of ceramics having piezoelectric characteristics. As such ceramics, for example, a perovskite type oxide made of lead zirconate titanate ($PbZrO_3$—$PbTiO_3$); lithium niobate ($LiNbO_3$); lithium tantalite ($LiTaO_3$) and so on can be used. A thickness of each of the piezoelectric layer 3 is preferably set to, for example, 0.01 to 0.1 mm for a drive at a low voltage. It is preferable that the piezoelectric layer 3 has a piezoelectric constant d31 of 200 pm/V or more for obtaining a larger bending vibration.

The surface electrode 5 electrically connected to the inner electrodes 2 is disposed on one main surface of the stacked body 4. The surface electrode 5 according to the embodiment shown in FIG. 1 includes a first surface electrode 51 having a larger area, and a second surface electrode 52 and a third surface electrode 53 which have smaller areas. For example, the first surface electrode 51 is electrically connected to the inner electrodes 2 to be the first electrodes 21, the second surface electrode 52 is electrically connected to the inner electrodes 2 to be the second electrodes 22 arranged on one main surface side and the third surface electrode 53 is electrically connected to the inner electrodes 2 to be the second electrodes 22 arranged on the other main surface side. In the case of the piezoelectric element installed in the display and the housing of the portable terminal, a length of the first surface electrode 51 is preferable, for example, 17 mm to 23 mm, and more preferably 19 mm to 21 mm. A width of the first surface electrode 51 is preferably, for example, 1 mm to 5 mm, and more preferably, 2 mm to 4 mm. A length of the second surface electrode 52 and the third surface electrode 53 is preferably, for example, 1 mm to 3 mm. A width of the second surface electrode 52 and the third surface electrode 53 is preferably, for example, 0.5 mm to 1.5 mm.

Then, the surface electrode 5 includes the first area 501 mainly containing silver and the second area 502 mainly containing silver palladium and contacting the piezoelectric layer 3. In other words, the surface electrode 5 includes the first area 501 and the second area 502, and the first area 501 is the area mainly containing silver and the second area 502 is the area mainly containing silver palladium and disposed so as to contact the piezoelectric layer 3.

As compared with the surface electrode, for example, mainly containing silver formed by the baking, the surface electrode 5 having the second area 502, for example, mainly containing silver palladium formed by co-firing is firmly joined to the piezoelectric layer 3 and the adhesion is increased. Therefore, the piezoelectric element in which the surface electrode 5 is not easily peeled off and the displacement amount is stable for a long period of time can be obtained.

In addition, as the second area 502 mainly containing silver palladium is formed in part of the surface electrode 5, the entire surface electrode 5 does not uniformly make a movement due to areas having different weights, and additionally, Ro (resonant resistance) is increased in the second area 502 (a place where much silver and palladium are contained), which can contribute to stabilization of the displacement amount.

In particular, the peeling of the surface electrode 5 is suppressed when a later-described flexible board 6 is adhered to one main surface, which can increase electrical connection reliability with respect to the flexible board 6.

It is effective when an area ratio between the second area 502 and the first area 501 at an interface between the surface electrode 5 and the piezoelectric layer 3 is, for example, 5:95 to 30:70. It is also effective when a volume ratio between the second area 502 and the first area 501 is, for example, 5:95 to 30:70.

Figure 2:
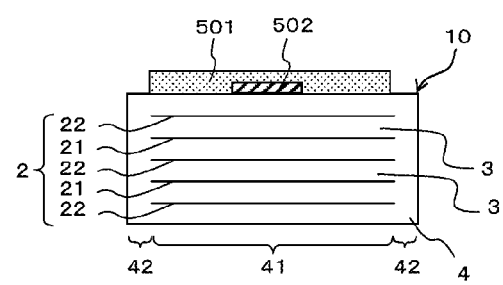
FIG. 2 is a schematic cross-sectional view showing another example of FIG. 1(b)

Here, it is preferable that the first area 501 covers the second area 502 as shown in FIG. 2. According to this structure, the surface electrode 5 can be firmly joined to the piezoelectric layer 3, occurrence of a microcrack at the interface between the surface electrode 5 and the piezoelectric layer 3 can be suppressed and the peeling of the surface electrode 5 can be suppressed.

Further, since the second area 502 mainly containing silver palladium is surrounded by the first area 501 mainly containing silver, the entire surface of the surface electrode 5 mainly contains silver, and a voltage is uniformly applied to the entire surface electrode 5 and the displacement amount is stable for a long period of time.

Further, the second area 502 preferably has a circular shape or elliptical shape in a plan view thereof, though not shown. According to this structure, since there is no corner at the outer periphery and there is no portion to which stress is concentrated, the displacement amount is stable for a long period of time.

As shown in FIG. 1 and FIG. 2, the inner electrodes 2 are composed of the first electrodes 21 and the second electrodes 22, and the stacked body 4 includes the active portion 41 in which the first electrodes 21 and the second electrodes 22 of the inner electrodes 2 are laminated in the stacking direction and the inactive portion 42 corresponding to portions other than the active portion 41 in which the first electrodes 21 and the second electrodes 22 are not laminated in the stacking direction. The second area 502 is preferably positioned on the active portion 41. According to this structure, when the second area 502 is arranged on the active portion 41 which makes a movement actively, such an arrangement is effective for suppressing the peeling of the surface electrode 5.

Figure 3:
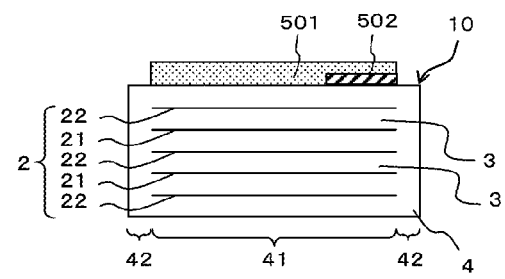
FIG. 3 is a schematic cross-sectional view showing another example of FIG. 1(b)

It is also preferable that the second area 502 is positioned in the vicinity of a boundary between the active portion 41 and the inactive portion 42 as shown in FIG. 3. When the second area 502 is arranged in a place where the stress is concentrated, such an arrangement is further effective for suppressing the peeling of the surface electrode 5.

Figure 4:
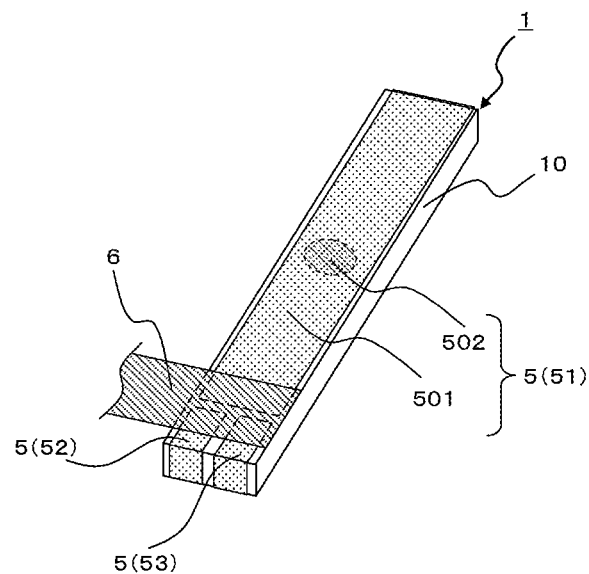
FIG. 4 is a schematic perspective view showing another example of the piezoelectric element according to the embodiment of the invention.

As shown in FIG. 4, the piezoelectric element 10 of the invention may include the flexible board 6 having a wiring conductor, and part of the flexible board 6 may be joined to one main surface of the stacked body 4 so that the surface electrode 5 is electrically connected to the wiring conductor through a conductive joining member.

The flexible board 6 is a flexible printed wiring board in which, for example, two wiring conductors are embedded in a resin film, and a connector (not shown) for connecting to an external circuit is connected to one end of the flexible board.

As the conductive joining member, a conductive adhesive, solder and the like are used, and the conductive adhesive is preferably used. This is because the stress generated due to vibration can be reduced as compared with solder by using the conductive adhesive obtained by dispersing conductor particles including gold, copper, nickel or gold-plated resin balls in a resin such as an acrylic resin, an epoxy resin, a silicone resin, a polyurethane resin or a synthetic rubber. It is more preferable to use an anisotropic conductive material in the conductive adhesives. The anisotropic conductive material includes conductive particles playing a role in electrical connection and a resin adhesive playing a role in adhesion. Since the anisotropic conductive material realizes conduction in the thickness direction and realizes insulation in the in-plane direction, electrical short-circuit does not occur between surface electrodes of different polarities even in narrow-pitch wiring and a connecting portion with respect to the flexible board 6 can be compact.

Moreover, as the other main surface of the piezoelectric element 10 is formed to be flat, bending vibration can be easily performed together with an object to which vibration is applied, for example, when the other main surface is adhered to the object (such as a later-described vibrating plate) to which vibration is applied, which can increase efficiency of bending vibration as a whole.

The piezoelectric element 10 shown in FIG. 1 is a so-called bimorph piezoelectric actuator, which performs bending vibration so that one main surface and the other main surface become bending surfaces by an electric signal inputted from the surface electrode 5. The piezoelectric actuator of the invention is not limited to the bimorph type, but a unimorph type can be applied. The unimorph piezoelectric actuator can also perform bending vibration by joining (adhering) the other main surface of the piezoelectric actuator to, for example, a later-described vibrating plate.

Next, a manufacturing method of the piezoelectric element 10 according to the embodiment will be explained.

First, a ceramic green sheet to be the piezoelectric layers 3 is prepared. Specifically, a ceramic slurry is prepared by mixing calcined powder of piezoelectric ceramics, a binder made of an organic polymer such as an acrylic polymer and a butyral polymer, and a plasticizer. Then, the ceramic green sheet is prepared by using the ceramic slurry by means of a tape molding method such as a doctor blade method or a calender roll method. As the piezoelectric ceramics, ones having piezoelectric characteristics can be applied, and for example, a perovskite type oxide or the like made of lead zirconate titanate ($PbZrO_3$—$PbTiO_3$) can be used. As the plasticizer, dibutyl phthalate (DBP), dioctyl phthalate (DOP) or the like can be used.

Next, a conductive paste to be the inner electrodes 2 is prepared. Specifically, the conductive paste is prepared by adding and mixing a binder and a plasticizer into metal powder of a silver-palladium alloy. The conductive paste is applied on the ceramic green sheet by means of a screen printing method in a pattern of the inner electrode 2. Furthermore, a plurality of ceramic green sheets on which the conductive paste is printed are laminated and a debinding process is performed at a given temperature, and then, the sheets are fired at a temperature of 900 to 1200° C. and a grinding process is performed by using a surface grinder or the like to be a given shape, thereby fabricating the stacked body 4 having the inner electrodes 2 and the piezoelectric layers 3 which are alternately laminated.

The stacked body 4 is not limited to the one fabricated by the above-described manufacturing method, and can be fabricated by any manufacturing method as long as the stacked body 4 can be prepared by laminating the inner electrodes 2 and the piezoelectric layers 3.

Next, a pattern of the second area 502 is formed by a conductive paste mainly containing silver and palladium on the surface of the stacked body 4. At this time, the pattern of the second area 502 is formed in a desired shape, thereby obtaining the second area 502 having the circular shape or elliptical shape in a plan view thereof.

After that, a conductive paste containing silver glass prepared by adding a binder, a plasticizer and a solvent to a mixture of conductive particles mainly containing silver and glass is printed on the main surface and the side surface of the stacked body 4 in the pattern of the surface electrode 5 by means of the screen printing method or otherwise and dried, then, a baking process is performed at a temperature of 650 to 750° C. to thereby form the surface electrode 5.

When the surface electrode 5 and the inner electrodes 2 are electrically connected, via holes piercing the piezoelectric layer 3 may be formed and a side surface electrode may be formed on the side surface of the stacked body 4, or any other manufacturing methods can be used.

Next, the flexible wiring board 6 is connected and fixed (joined) to the piezoelectric element 10 by using a conductive adhesive.

First, a paste for the conductive adhesive is applied and formed at a given position of the piezoelectric element 10 by means of the screen printing method or otherwise. After that, the flexible wiring board 6 is connected and fixed to the piezoelectric element 10 by curing the paste for the conductive adhesive in a state where the flexible wiring board 6 abuts on the piezoelectric element 10. The paste for the conductive adhesive may be applied and formed on the flexible wiring board 6 side.

When the resin forming the conductive adhesive is made of a thermoplastics resin, the thermoplastics resin softens and flows by heating and pressurizing the piezoelectric element 10 and the flexible wiring board 6 in the abutting state through the conductive adhesive after the conductive adhesive is applied and formed at a given position of the piezoelectric element 10 or the flexible wiring board 6. After that, the thermoplastics resin is cured again by allowing the resin to reach a room temperature, and the flexible wiring board 6 is connected and fixed to the piezoelectric element 10.

Here, in order to arrange many conductive particles constituting the conductive adhesive at a peripheral portion of the area where the flexible wiring board overlays the piezoelectric element in a plan view thereof, it is sufficient that the conductive adhesive paste having a higher content of conductive particles is prepared, and the conductive adhesive paste having the higher content of conductive particles is applied and formed at the peripheral portion.

In particular, when an anisotropic conductive member is used as the conductive adhesive, it is necessary to control the pressure amount so that neighboring conductive particles do not contact one another.

Through the method in which the conductive adhesive is applied and formed at the piezoelectric element 10 or the flexible wiring board 6 has been shown in the above-mentioned example, the piezoelectric element 10 may be joined to the flexible wiring board 6 by heating and pressurization in a state of sandwiching a sheet of the conductive adhesive formed in a sheet shape in advance between the piezoelectric element 10 and the flexible wiring board 6.

Figure 5:
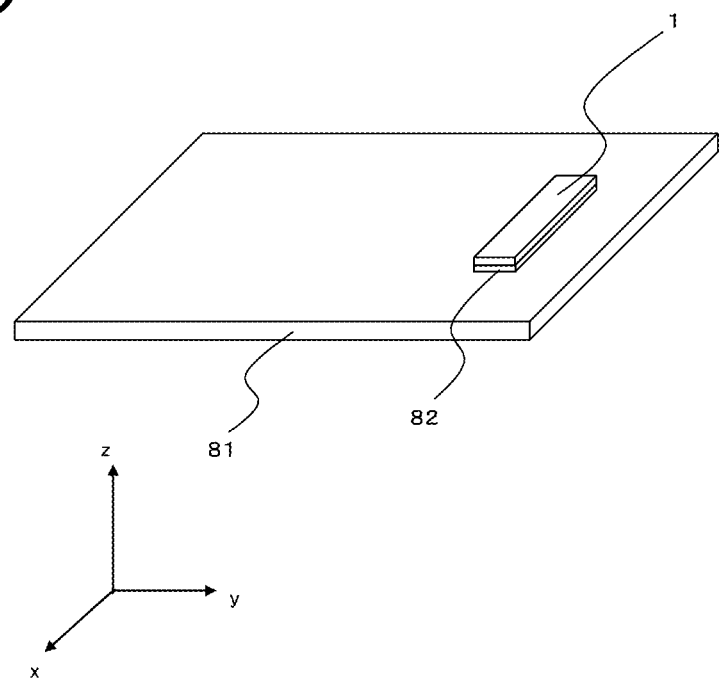
FIG. 5 is a schematic perspective view schematically showing a piezoelectric vibrating device according to an embodiment of the invention.

A piezoelectric vibrating device according to the embodiment includes the piezoelectric element 10 and a vibrating plate 81 joined to the other main surface of the piezoelectric element 10 as shown in FIG. 5.

The vibrating plate 81 has a rectangular thin-plate shape. The vibrating plate 81 can be formed by preferably using a material having high rigidity and elasticity such as an acrylic resin or glass. A thickness of the vibrating plate 81 is preferably set to, for example, 0.4 mm to 1.5 mm.

The vibrating plate 81 is joined to the other main surface of the piezoelectric element 10 through a joining member 82. Through the joining member 82, the entire surface of the other main surface may be joined to the vibrating plate 81, and the substantially entire surface may be joined thereto.

The joining member 82 has a film shape. The joining member 82 is made of a softer and more deformable material than that of the vibrating plate 81, and has smaller modulus of elasticity and rigidity such as Young's modulus, a rigidity modulus and a volume modulus as compared with the vibrating plate 81. That is, the joining member 82 can be deformed when the vibrating plate 81 is vibrated by the driving of the piezoelectric element 10, and is deformed more largely than the vibrating plate 81 when the same force is applied. Then, the entire other main surface (main surface on −z direction side in the drawing) of the piezoelectric element 10 is fixedly adhered to one main surface (main surface on +z direction side in the drawing) of the joining member 82, and part of one main surface (main surface on +z direction side in the drawing) is fixedly adhered to the other main surface (main surface on −z direction side in the drawing) of the joining member 82.

By joining the piezoelectric element 10 and the vibrating plate 81 by the joining member 82 which can be deformed, the deformable joining member 82 is largely deformed as compared with the vibrating plate 81 when the vibration is transmitted from the piezoelectric element 10.

Since opposite-phase vibration reflected from the vibrating plate 81 can be alleviated by the deformable joining member 82 at this time, it is possible to transmit strong vibration to the vibrating plate 81 without any effects of ambient vibration in the piezoelectric element 10.

In particular, it is preferable that at least part of the joining member 82 is formed by a viscoelastic body because strong vibration from the piezoelectric element 10 can be transmitted to the vibrating plate 81 and weak vibration reflected from the vibrating plate 81 can be absorbed by the joining member 82. For example, the joining member including a double-sided tape in which an adhesive is put on both sides of a base material made of a non-woven fabric or an adhesive having elasticity can foe used, which has a thickness of, for example, 10 μm to 2000 μm.

The joining member 82 may be a single member or a composite body made of some members. As the joining member 82, for example, the double-sided tape in which the adhesive is put on both sides of the base material made of the non-woven fabric and various elastic adhesives which are adhesives having elasticity can be preferably used. It is desirable that a thickness of the joining member 82 is larger than the amplitude of bending vibration of the piezoelectric element 10, however, the vibration is attenuated when the thickness is too large. Therefore, the thickness is set to, for example, 0.1 mm to 0.6 mm. However, in the piezoelectric vibrating device of the invention, the material for the joining member 82 is not limited, and the joining member 82 may be made of a material which is more rigid and is less prone to be deformed as compared with the vibrating plate 81. A structure not including the joining member 82 may be applied in some cases.

The piezoelectric vibrating device having such a structure causes the piezoelectric element 10 to perform bending vibration by applying an electric signal and accordingly functions as the piezoelectric vibrating device vibrating the vibrating plate 81. It is also possible to support the other end portion (an end portion in a −y direction in the drawing, a peripheral portion of the vibrating plate 81 and so on) in the longitudinal direction of the vibrating plate 81 by a not-shown support member.

Since the piezoelectric vibrating device according to the embodiment is configured by using the piezoelectric element 10 in which the peeling of the surface electrode is suppressed, the piezoelectric vibrating device which is driven stably for a long period of time can be realized.

Also in the piezoelectric vibrating device according to the embodiment, the vibrating plate 81 is joined to the flat other main surface of the piezoelectric element 10. Accordingly, the piezoelectric vibrating device in which the piezoelectric element 10 and the vibrating plate 31 are firmly joined can be realized.

Figure 6:
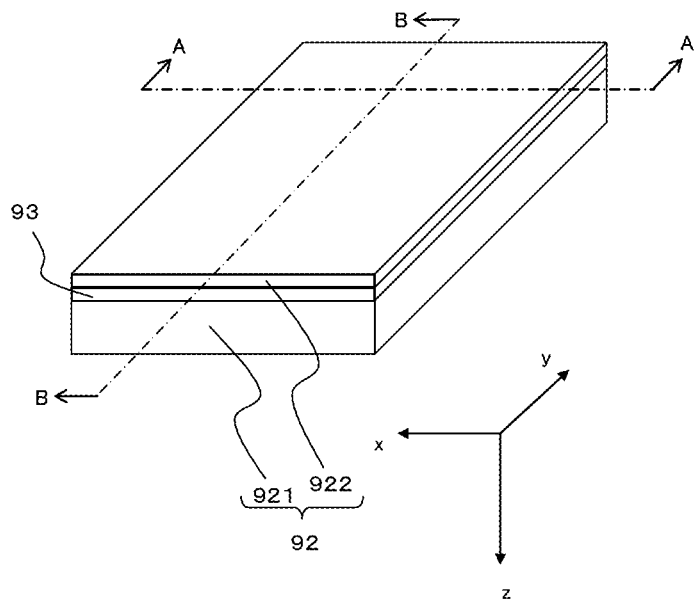
FIG. 6 is a schematic perspective view schematically showing a portable terminal according to an embodiment of the invention.
Figure 7:
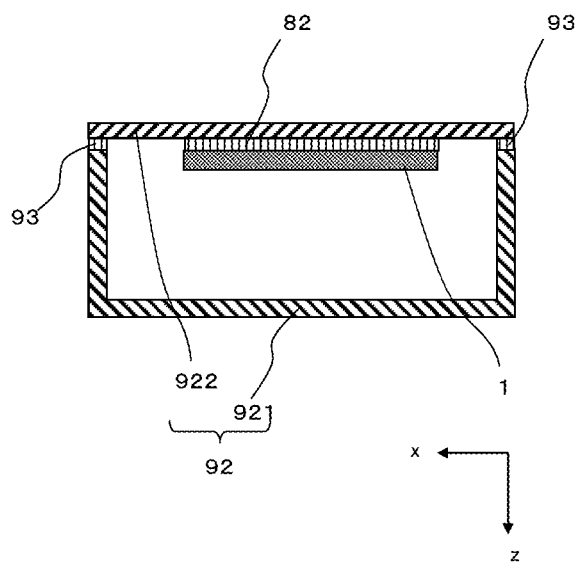
FIG. 7 is a schematic cross-sectional view taken along the line A-A shown in FIG. 6.
Figure 8:
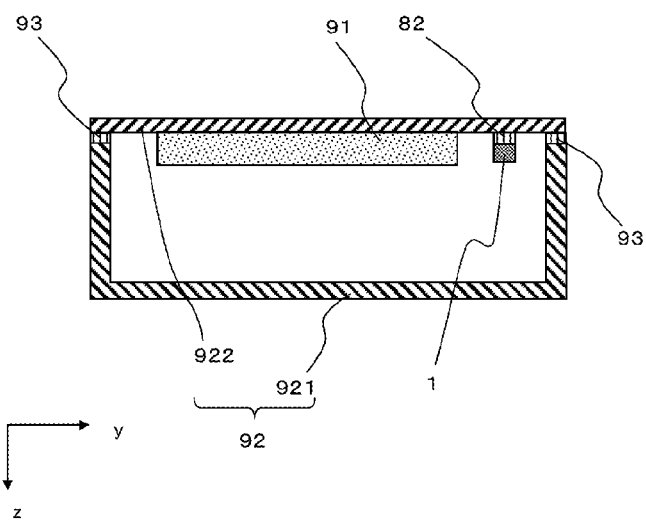
FIG. 8 is a schematic cross-sectional view taken along the line B-B shown in FIG. 6.

The portable terminal according to the embodiment includes the piezoelectric element 10, an electronic circuit (not shown), a display 91 and a housing 92, in which the other main surface of the piezoelectric element 10 is joined to the housing 92. FIG. 6 is a schematic perspective view schematically showing the portable terminal of the invention, FIG. 7 is a schematic cross-sectional view taken along the line A-A shown in FIG. 6, and FIG. 8 is a schematic cross-sectional view taken along the line B-B shown in FIG. 6.

Here, it is preferable that the piezoelectric element 10 and the housing 92 are joined by using a deformable joining member. That is, the joining member 82 is the deformable joining member in FIG. 7 and FIG. 8.

By joining the piezoelectric element 10 and the housing 92 by the deformable joining member 82, the deformable joining member 82 is deformed largely as compared with the housing 92 when vibration is transmitted from the piezoelectric element 10.

Since opposite-phase vibration reflected from the housing 92 can foe alleviated by the deformable joining member 82 at this time, it is possible to transmit strong vibration to the housing 92 without any effects of ambient vibration in the piezoelectric element 10.

In particular, it is preferable that at least part of the joining member 82 is formed by a viscoelastic body from a point of view that strong vibration from the piezoelectric element 10 can be transmitted to the housing 92 and weak vibration reflected from the housing 92 can be absorbed by the joining member 82. For example, the joining member including the double-sided tape in which the adhesive is put on both sides of the base material made of the non-woven fabric or an adhesive having elasticity can be used, which has a thickness of, for example, 10 μm to 2000 μm.

In the embodiment, the piezoelectric element 10 is attached to part of the housing 92 to be a cover of the display 91, and the part of the housing 92 functions as a vibrating plate 922.

Though the case in which the piezoelectric element 10 is joined to the housing 92 is shown in the embodiment, the piezoelectric element 10 may foe joined to the display 91.

The housing 92 includes a box-shaped housing main body 921 in which one surface is opened, and the vibrating plate 922 closing the opening of the housing main body 921. The housing 92 (the housing main body 921 and the vibrating plate 922) can be formed by preferably using a material such as a synthetic resin having high rigidity and modulus of elasticity.

A peripheral portion of the vibrating plate 922 is attached to the housing main body 921 through a joining material 93 so as to be able to vibrate. The joining material 93 is made of a softer and more deformable material than the vibrating plate 922, and has smaller modulus of elasticity and rigidity such as Young's modulus, a rigidity modulus and a volume modulus as compared with the vibrating plate 922. That is, the deformable joining material is deformed more largely than the vibrating plate 922 when the same force is applied.

The joining material 93 may be a single member or a complex including some members. As the joining material 93, the double-sided tape in which the adhesive is put on both sides of the base material made of the non-woven fabric and so on can be preferably used. A thickness of the joining member 93 is set to, for example, 0.1 mm to 0.6 mm so that the vibration is not attenuated as the thickness is too large. However, in the portable terminal of the invention, the material for the joining material 92 is not limited, and the joining material 93 can be made of a material which is more rigid and is less prone to be deformed as compared with the vibrating plate 922. A structure not including the joining material 93 may be applied in some cases.

As the electronic circuits (not shown), circuits processing image information displayed on the display 91 and audio information transmitted by the portable terminal, a communication circuit and so on can be exemplified. The electronic circuit may include at least one of these circuits or may include ail circuits. The electronic circuit may include circuits having other functions. Moreover, plural electronic circuits can be included. The electronic circuit and the piezoelectric element 10 are connected by a not-shown wiring for connection.

The display 91 is a display device having a function of displaying image information, and well-known displays such as a liquid crystal display, a plasma display and an organic EL display can be preferably used. The display 91 can be the one having an input device such as a touch panel. The cover (the vibrating plate 922) of the display 91 can have the input device such as the touch panel. Further, the entire display 91 or part of the display 91 can function as the vibrating plate.

The portable terminal according to the embodiment is characterized in that the display 91 or the housing 92 generates vibration transmitting sound information through the cartilage of an ear or air conduction. The portable terminal according to the embodiment can transmit sound information by allowing the vibrating plate (the display 91 or the housing 92) to contact the ear directly or through something to thereby transmit the vibration to the cartilage of the ear. That is, the sound information can be transmitted by allowing the vibrating plate (the display 91 or the housing 92) to contact the ear directly or indirectly to thereby transmit the vibration to the cartilage of the ear. Accordingly, the portable terminal capable of transmitting sound information can be obtained, for example, even in a noisy environment. An object interposed between the vibrating plate (the display 91 or the housing 92) and the ear may be, for example, the cover of the portable terminal, a headphone, an earphone and any other object which can transmit the vibration. The portable terminal may be the one transmitting sound information by propagating sound generated from the vibrating plate (the display 91 or the housing 92) in the air. Furthermore, the portable terminal may be the one transmitting sound information through plural routes.

As the portable terminal according to the embodiment transmits sound information by using the piezoelectric element 10 in which the peeling of the surface electrode is suppressed, high quality sound information can be transmitted stably for a long period of time.

Figure 9:
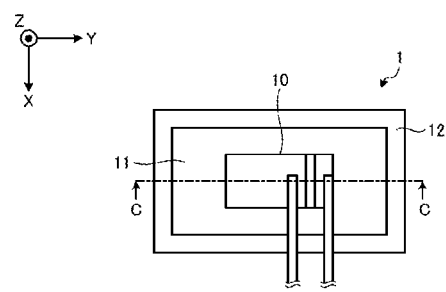
FIG. 9(a) is a schematic plan view showing a schematic structure of an acoustic generator according to an embodiment of the invention.
FIG. 9(b) is a cross-sectional view (No. 1) taken along the line C-C of FIG. 9(a)
FIG. 9(c) is a cross-sectional view (No. 2) taken along the line C-C of FIG. 9(a)
Figure 9:
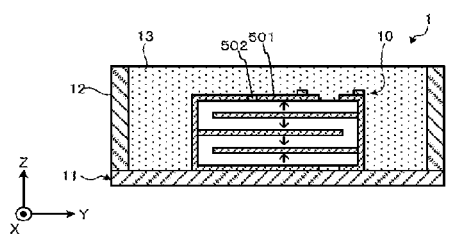
Figure 9:
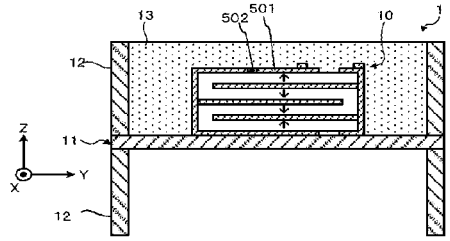

An acoustic generator 1 according to the embodiment is provided with the piezoelectric element 10, a vibrating plate 11 to which the piezoelectric element 10 is attached and which vibrates with the piezoelectric element 10 by vibration of the piezoelectric element 10 and a frame body 12 disposed at an outer peripheral portion of the vibrating plate 11 as shown in FIG. 9.

The piezoelectric element 10 is an exciter for exciting the vibrating plate 11 by performing vibration through application of voltage. Since a main surface of the piezoelectric element 10 and a main surface of the vibrating plate 11 are joined by an adhesive such as an epoxy resin and the piezoelectric element 10 performs bending vibration, the piezoelectric element 10 gives constant vibration to the vibrating plate 11 to thereby generate sound. A length of the piezoelectric element 10 used for the acoustic generator 1 is preferably, for example, 10 mm to 50 mm. A width of the piezoelectric element 10 is preferably, for example, 1 mm to 20 mm. A thickness of the piezoelectric element 10 is preferably, for example, 0.05 mm to 1.5 mm.

The vibrating plate 11 is configured so that a peripheral portion is fixed to the frame body 12 with tension and so as to vibrate with the piezoelectric element 10 by the vibration of the piezoelectric element 10. The vibrating plate 11 can be formed by using various materials such as resins or metals, and the vibrating plate 3 can be configured by using, for example, a resin film such as polyethylene, polyimide, polypropylene and so on having a thickness of 10 to 200 μm. Since the resin film is a material having a lower modulus of elasticity and mechanical Q-value as compared with a metal plate or the like, by forming the vibrating plate 11 from the resin film, the vibrating plate 11 can perform bending vibration with a large amplitude, and the difference between a resonance peak and a dip can be reduced by widening the width of the resonance peak and reducing the height of the resonance peak in frequency characteristics of sound pressure.

The frame body 12 functions as a support for supporting the vibrating plate 11 at the peripheral portion of the vibrating plate 11, and can be formed of various materials, for example, metals such as stainless steel, or resins. The frame body 12 may be composed of one frame member as shown in FIG. 9(*b*), and may be composed of two frame members as shown in FIG. 9(*c*). In this case, the tension of the vibrating plate 11 can be stabilized by interposing the vibrating plate 11 between the two frame members. A thickness of the frame member is set to, for example, 100 to 500 μm.

It is preferable that the acoustic generator 1 according to the embodiment further includes a resin layer 13 disposed so as to cover at least a part of a surface of the piezoelectric element 10 and the vibrating plate 11 as shown in FIG. 9(*b*) and FIG. 9(*c*). As the resin layer 13, for example, an acrylic resin can be used. Since appropriate damper effect can be induced by embedding the piezoelectric element 10 in the resin layer 13, it is possible to suppress a resonance phenomenon and suppress the peak and the dip to be small in the frequency characteristics of sound pressure. As shown in FIG. 9(*b*) and FIG. 9(*c*), the resin layer 13 may be formed to be the same height as the frame body 12.

Since, in such an acoustic generator 1, the surface electrode of the piezoelectric element 10 is less prone to be peeled off and the displacement amount is stable for a long period of time as described above, the acoustic generator having excellent durability can be obtained.

Figure 10:
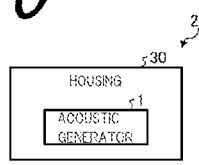
FIG. 10 is a view showing a configuration of an acoustic generating device according to an embodiment of the invention.
Figure 11:
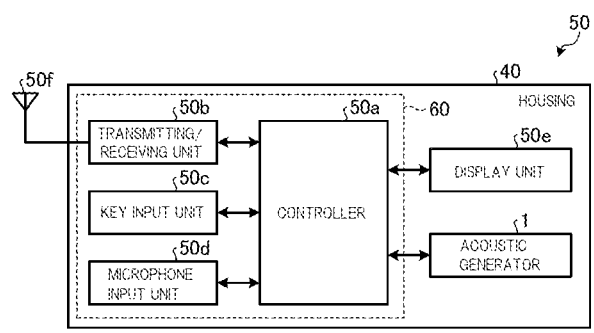
FIG. 11 is a view showing a configuration of an electronic apparatus according to an embodiment of the invention.

Next, an acoustic generating device and an electronic apparatus on which the acoustic generator 1 is mounted will be explained with reference to FIG. 10 and FIG. 11. FIG. 10 is a view showing a configuration of an acoustic generating device 20 according to an embodiment and FIG. 11 is a view showing a configuration of an electronic apparatus 50 according to an embodiment. In both drawings, only components necessary for explanation are shown and description of common components is omitted.

The acoustic generating device 20 is a sound generating device such as a so-called speaker, and includes, for example, the acoustic generator 1 and a housing 30 configured to accommodate the acoustic generator 1 as shown in FIG. 10. The housing 30 resonates sound generated by the acoustic generator 1 inside the housing 30 and emanates the sound to the outside from a not-shown opening formed in the housing 30. Since such a housing 30 is provided, it is possible to increase the sound pressure, for example, in a low-frequency band.

The acoustic generator 1 can be mounted on various types of electronic apparatuses 50. For example, the electronic apparatus 50 is a portable terminal device such as a cellular phone or a tablet terminal as in FIG. 11 described below.

As shown FIG. 11, the electronic apparatus 50 includes an electronic circuit 60. The electronic circuit 60 includes, for example, a controller 50*a*, a transmitting/receiving unit 50*b*, a key input unit 50*c*, and a microphone input unit 50*d*. The electronic circuit 60 is connected to the acoustic generator 1, and has a function of outputting an audio signal to the acoustic generator 1. The acoustic generator 1 generates sound based on the audio signal inputted from the electronic circuit 60.

The electronic apparatus 50 also includes a display unit 50*e*, an antenna 50*f*, and the acoustic generator 1. The electronic apparatus 50 further includes a housing 40 configured to accommodate these respective devices. Although FIG. 11 shows a state where all respective devices including the controller 50*a* are accommodated in one housing 40, the accommodation form of respective devices is not limited. It is sufficient that at least the electronic circuit 60 and the acoustic generator 1 are accommodated in one housing 40 in the embodiment.

The controller 50*a* is a control unit of the electronic apparatus 50. The transmitting/receiving unit 50*b* transmits/receives data and so on through the antenna 50*f* under the control of the controller 50*a*. The key input unit 50*c* is an input device of the electronic apparatus 50, and receives key input operations by an operator. The microphone input unit 50*d* is an input device of the electronic apparatus 50, and receives audio input operations and so on by the operator. The display unit 50*e* is a display output device of the electronic apparatus 50, and outputs display information under the control of the controller 50*a*.

Then, the acoustic generator 1 is operated as an acoustic output device in the electronic apparatus 50. The acoustic generator 1 is connected to the controller 50*a* of the electronic circuit 60, and generates sound by application of voltage controlled by the controller 50*a*.

Though the explanation has been made on the assumption that the electronic apparatus 50 is a portable terminal device in FIG. 11, the invention may be applied to various consumer apparatuses having a function of generating sound regardless of the type of the electronic apparatus 50. For example, the invention can be applied to various products including not only a flat-screen television and a car audio apparatus but also products having a function of generating a sound such as "speak" function, for example, a vacuum cleaner, a washing machine, a refrigerator, a microwave oven and so on.

EXAMPLES

A specific example of the piezoelectric element according to the invention will be explained. Specifically, the piezoelectric element shown in FIG. 1 was fabricated as described below.

The piezoelectric element was formed in a rectangular parallelepiped shape with a length of 23.5 mm, a width of 3.3 mm and a thickness of 0.5 mm. The piezoelectric element was formed so that piezoelectric layers and inner electrodes with a thickness of 30 μm were alternately laminated and the total number of the piezoelectric layers were 16 layers. The piezoelectric layers were formed of lead zirconate titanate. As the inner electrodes, the silver-palladium alloy was used.

After ceramic green sheets on which the conductive paste made of silver palladium was printed were laminated, the sheets were closely adhered by pressure and degreased at a given temperature, then, fired at 1000° C. to obtain a stacked sintered body.

At this time, a pattern forming of the second area having a circular shape was performed on the surface layer face by using the silver palladium paste and co-firing was performed.

Next, the silver paste was printed so as to be 1 mm longer than the inner electrodes at both ends in the width direction thereof and baked to thereby form the surface electrode.

Then, a voltage with an electric field intensity of 2 kV/mm was applied between inner electrodes (between the first electrode and the second electrode) through the surface electrode, thereby performing polarization to the piezoelectric element.

After that, the conductive adhesive containing gold-plated resin balls as conductive particles was applied and formed on the surface of the piezoelectric element to be joined to the flexible wiring board. At this time, a conductive adhesive containing 20 vol % conductive particles was applied and formed in an area of a width of 0.3 mm at a peripheral portion of the area where the flexible wiring board overlays the piezoelectric element, and a conductive adhesive containing 10 vol % conductive particles was applied and formed in an area inside of the above area.

After that, the flexible wiring board was conducted and fixed to the piezoelectric element by heating and pressurizing the flexible wiring board in a state where the flexible wiring board abuts on the piezoelectric element to thereby fabricate the piezoelectric element (Sample No. 1) which is an example of the invention. As the above-described conductive adhesive, an anisotropic conductive material which was conductive in the thickness direction and was not conductive in the in-plane direction, was used.

As a comparative example, a piezoelectric element (Sample No. 2) beyond the scope of the invention was fabricated, which had the same configuration as the above sample No. 1 except that the forming process of the second area was omitted.

As a result of performing the driving test to respective piezoelectric elements by applying a sinusoidal signal of an effective value ±10 Vrms at a frequency of 1 kHz through the flexible wiring board, bending vibration having a displacement amount of 100 μm was obtained in both samples No. 1 and 2.

Next, a sinusoidal signal of an effective value of 3 V was inputted with changing the frequency in a range of 0.2 to 5000 Hz and whether the depression of displacement amount caused by a spark on the joining surface of the flexible wiring board occurred or not was checked. As a result, the depression of displacement amount was not observed in the piezoelectric element of Sample No. 1 according to the embodiment of the invention. Whereas, in the piezoelectric element of Sample No. 2 beyond the scope of the invention, the abnormal depression of displacement amount was measured.

After that, the driving test was performed by applying the sinusoidal signal of the effective value ±10 Vrms continuously for one hundred thousand cycles. In Sample No. 2 beyond the scope of the invention, the depression of displacement amount occurred, and the flexible wiring board was peeled off from the piezoelectric element in ninety thousand cycles.

On the other hand, the piezoelectric element of Sample No. 1 which is the example of the invention was driven without depression of the displacement amount even after one hundred thousand cycles. The peeling of the flexible wiring board was not observed.

The excellent durability could be confirmed without occurrence of the problem that the flexible wiring board was peeled off from the piezoelectric element even after continuous driving for a long period of time by using the piezoelectric element of the invention.

REFERENCE SIGNS LIST

10: Piezoelectric element
2: Inner electrode
21: First electrode
22: Second electrode
3: Piezoelectric layer
4: Stacked body
41: Active portion
42: inactive portion
5: Surface electrode
51: First surface electrode
52: Second surface electrode
53: Third surface electrode
501: First area
502: Second area
6: Flexible wiring board
81: Vibrating plate
82: Joining member
91: Display
92: Housing
921: Housing main body
922: Vibrating plate
93: Joining material
1: Acoustic generator
11: Vibrating plate
12: Frame body
13: Resin layer
20: Acoustic generating device
30, 40: Housing
50: Electronic apparatus
50a: Controller 50*b*: Transmitting/receiving unit
50*c*: Key input unit
50*d*: Microphone input unit
50*e*: Display unit
50*f*: Antenna
60: Electronic circuit

The invention claimed is:

1. A piezoelectric element, comprising:
a plate-shaped stacked body comprising inner electrodes and piezoelectric layers laminated; and
a surface electrode disposed on one of main surfaces of the plate-shaped stacked body, the surface electrode being electrically connected to the inner electrodes,
the surface electrode having a first area and a second area,
the second area being an area which mainly contains silver palladium and is disposed so as to contact a piezoelectric layer,
the first area being an area which mainly contains silver, covers the second area and is disposed so as to contact the piezoelectric layer around the second area.

2. The piezoelectric element according to claim 1,
wherein the second area has a circular shape or elliptical shape in a plan view thereof.

3. The piezoelectric element according to claim 1,
wherein the inner electrodes are composed of first electrodes and second electrodes,
the plate-shaped stacked body has an active portion in which the first electrodes and the second electrodes of the inner electrodes are overlaid in a stacking direction and an inactive portion in which the first electrodes and the second electrodes of the inner electrodes are not overlaid in the stacking direction, and
the second area is positioned on the active portion.

4. The piezoelectric element according to claim 3,
wherein the second area is positioned in a vicinity of a boundary between the active portion and the inactive portion.

5. A piezoelectric vibrating device, comprising:
the piezoelectric element according to claim 1, and
a vibrating plate joined to the other main surface of the piezoelectric element.

6. The piezoelectric vibrating device according to claim 5,
wherein the piezoelectric element and the vibrating plate are joined by using a deformable joining member.

7. A portable terminal, comprising:
the piezoelectric element according to claim 1,
an electronic circuit;
a display; and
a housing,
the other main surface of the piezoelectric element being joined to the display or the housing.

8. The portable terminal according to claim 7,
wherein the piezoelectric element and the display or the housing are joined by using a deformable joining member.

9. The portable terminal according to claim 7 or 8,
wherein the display or the housing generates vibration for transmitting sound information through a cartilage of an ear or air conduction.

10. An acoustic generator, comprising:
the piezoelectric element according to claim 1,
a vibrating plate to which the piezoelectric element is attached and which vibrates with the piezoelectric element by vibration of the piezoelectric element; and
a frame body disposed at an outer peripheral portion of the vibrating plate.

11. The acoustic generator according to claim 10, further comprising:
a resin layer disposed so as to cover at least a part of a surface of the piezoelectric element and the vibrating plate.

12. An acoustic generating device, comprising:
the acoustic generator according to claim 10; and
a housing configured to accommodate the acoustic generator.

13. An electronic apparatus, comprising:
the acoustic generator according to claim 10;
an electronic circuit connected to the acoustic generator;
a housing configured to accommodate the electronic circuit and the acoustic generator,
the electronic apparatus having a function of generating sound from the acoustic generator.

14. The piezoelectric element according to claim 1, wherein an area ratio between the second area and the first area at an interface between the surface electrode and the piezoelectric layer ranges from 5:95 to 30:70.

15. The piezoelectric element according to claim 1, wherein a volume ratio between the second area and the first area ranges from 5:95 to 30:70.

\* \* \* \* \*